(12) United States Patent
Huang et al.

(10) Patent No.: US 6,415,403 B1
(45) Date of Patent: Jul. 2, 2002

(54) PROGRAMMABLE BUILT IN SELF TEST FOR EMBEDDED DRAM

(75) Inventors: Jing-Reng Huang; Chih-Tsun Huang; Chi-Feng Wu; Cheng-Wen Wu, all of Hsin-Chu (TW)

(73) Assignee: Global Unichip Corporation, Hsin-Chu (TW)

( * ) Notice: Subject to any disclaimer, the term of this patent is extended or adjusted under 35 U.S.C. 154(b) by 0 days.

(21) Appl. No.: 09/334,569

(22) Filed: Jun. 21, 1999

Related U.S. Application Data
(60) Provisional application No. 60/117,787, filed on Jan. 29, 1999.

(51) Int. Cl.[7] .............................................. G01R 31/28
(52) U.S. Cl. ........................ 714/726; 714/718; 714/733
(58) Field of Search ............................. 365/201; 714/7, 714/726, 718, 733, 719, 727, 729; 711/106

(56) References Cited

U.S. PATENT DOCUMENTS

| | | | | |
|---|---|---|---|---|
| 5,764,655 | A | | 6/1998 | Kirihata et al. ............. 371/22.5 |
| 5,818,772 | A | * | 10/1998 | Kuge .......................... 365/201 |
| 5,825,785 | A | | 10/1998 | Barry et al. ................ 371/22.4 |
| 5,961,653 | A | * | 10/1999 | Kalter et al. .................... 714/7 |
| 6,185,709 | B1 | * | 2/2001 | Dreibelbis et al. .......... 714/726 |
| 6,230,290 | B1 | * | 5/2001 | Heidel et al. ............... 714/718 |
| 6,233,184 | B1 | * | 5/2001 | Barth et al. .................. 365/201 |
| 6,272,588 | B1 | * | 8/2001 | Johnston et al. ............ 711/106 |

OTHER PUBLICATIONS

Dekker et al., "A Realistic Self–Test Machine for Static Random Access Memories", 1988 International Test Conference, Paper 20.2, pp. 353–361.

Huang et al., "A Programmable BIST Core for Embedded DRAM", IEEE Design & Test of Computers, Jan.–Mar. 1999, pp. 2–13.

Dreibelbis et al., "Processor–Based Built–In Self–Test for Embedded DRAM", IEEE Journal of Solid–State Circuits, vol. 33, No. 11, Nov. 1998, pp. 1731–1740.

Tanoi et al., "On–Wafer BIST of a 200–Gb/s Failed–Bit Search for 1–Gb DRAM", IEEE Journal of Solid–State Circuits, vol. 32, No. 11, Nov. 1997, pp. 1735–1742.

Camurati et al., "Industrial BIST of Embedded RAMs", IEEE Design & Test of Computers, Fall 1995, pp. 86–95.

Treuer et al., "Built–In Self–Diagnosis for Repairable Embedded RAM's", IEEE Design & Test, Jun. 1993, pp. 24–33.

Nadeau–Dostie et al., "Serial Interfacing for Embedded–Memory Testing", IEEE Design & Test of Computers, Apr. 1990, pp. 52–63.

\* cited by examiner

*Primary Examiner*—David Ton
(74) *Attorney, Agent, or Firm*—George O. Saile; Stephen B. Ackerman

(57) ABSTRACT

In the present invention a built in self test (BIST) for an embedded memory is described. The BIST can be used at higher levels of assembly and for commodity memories to perform functional and AC memory tests. A BIST controller comprising a finite state machine is used to step through a test sequence and control a sequence controller. The sequence controller provides data and timing sequences to the embedded memory to provide page mode and non-page mode tests along with a refresh test. The BIST logic is scan tested prior to performing the built in self test and accommodations for normal memory refresh is made throughout the testing. The BIST also accommodates a burn-in test where unique burn-in test sequences can be applied.

23 Claims, 4 Drawing Sheets

US 6,415,403 B1

PROGRAMMABLE BUILT IN SELF TEST FOR EMBEDDED DRAM

This Application claims the benefit of U.S. Provisional Application No. 60/117,787, filed Jan. 29, 1999.

BACKGROUND OF THE INVENTION

1. Field of Invention

This invention relates to testing of integrated circuits and in particular to testing embedded DRAM's

2. Description of Related Art

There has long been a desire to integrate a computer onto a single chip, and the progress in device geometries is making it possible to consider a processor and memory integrated together on the same semiconductor chip. Putting together these two functions on a single chip puts a demand on testing and how to insure that each function is working correctly. Providing a built in self test, otherwise known as a BIST, is a way of allowing an embedded memory function to be tested separate from the processor function and to provide an assurance the memory will operate properly.

In U.S. Pat. No. 5,825,785 (Barry et al.) a built in self test capability is described for embedded macros using a state machine based controller. A built in self test circuit receives a scan vector that describes the parameters of the embedded macro that is to be tested. In U.S. Pat. No. 5,764,655 (Kirihata et al.) an integrated circuit chip is described that contains a built in self test and a nonvolatile RAM and includes an RF circuit for transmitting test results to a detector external to the chip. The present invention is described in C. Huang et al., "A Programmable BIST CORE for Embedded DRAM", IEEE Design & Test of Computers, January–March 1999, pp 2–13. In J. Dreibelbis, "Processor-Based Built-In Self-Test for Embedded DRAM", IEEE Journal of Solid State Circuits, Vol. 33, No. 11, November 1998, pp 1731–1740, a built-in self-test engine and test methodology was developed for testing a family of high bandwidth and high density DRAM macros. The processor based test engine has two separate instruction storage memories and combines with address, data and clock generators to provide high performance ac testing of a DRAM. In S. Tanoi et al., "On-Wafer BIST of a 200-Gb/s Failed-Bit Search for 1-Gb DRAM", IEEE Journal of Solid State Circuits, Vol. 32, No. 11, November 1997, pp 1735–1742, an on-wafer built-in self-test (BIST) test technique is discussed. The technique was developed to implement a 200-Gb/s failed-bit search for a 1-Gb DRAM. The BIST circuits include a very long word bus and test management circuit to probe DRAM arrays and compress test results. Read/compare circuits are embedded in sense amplifiers to identify failed bit column address.

In P. Camurati et al., "Industrial BIST of Embedded RAMs", IEEE Design & Test of Computers, Fall 1995, pp 86–95, a built-in self-test scheme is discussed for deeply embedded memories. A test pattern generation algorithm is implemented in hardware and extending to word based memories. In R. Treuler et al., "Built-In Self-Diagnosis for Repairable Embedded RAMs", IEEE Design & Test, June 1993, pp 24–32, a method of built-in self-diagnosis (BISD) is presented. The test circuit contains a small reduced instruction set processor which executes diagnostic algorithms stored in a ROM. The algorithms employ hybrid serial/parallel and modular operations depending whether external or self repair is required. In B. Nadeau-Dostie et al., "Serial Interfacing for Embedded-Memory Testing", IEEE Design & Test of Computers, April 1990, pp 52–63, a serial interfacing scheme is presented where several embedded memories share the same built in self test circuit. The approach requires only two serial pins to access the data path. A test pattern is applied every clock cycle as a result of the memory shifting the test data. In R. Dekker et al., "A Realistic Self-Test Machine for Static Random Access Memories", 1988 International Test Conference, Paper 20.2, pp 353–361, a specification and implementation is described for a self test machine for static random access memories. There were several improvements over then existing self test machines, including improved test algorithms, machine structure independent of address and data scrambling, data backgrounds generated on chip, include a data retention test, suitable for both embedded and stand alone SRAM's, and small silicon overhead due to the symmetric structure.

Testing embedded memories, such as DRAM's, is more difficult than testing commodity memory chips because of the accessibility of the embedded memory. The surrounding logic must be isolated and a design for testability can result in extra hardware overhead. In addition, there can be performance penalties along with noise and parasitic effects. An external memory tester is expensive, and considering the increased speed and bandwidth associated with embedded memories, it is difficult to produce an adequate test capability. Trying to maintain an adequate test capability in an environment of engineering change only adds to the difficulties of an external tester.

Providing a built in self test capability allows a much simpler and less costly tester to be used in testing a chip containing an embedded memory. With built in self test the embedded memory can be more easily isolated and can be tested at operating speeds. Testing at higher levels of assembly to can provide diagnostics in situ. By providing a capability to introduce different test sequences, a built in self test can test for critical timing during wafer test, pre-burn-in test, burn-in test and final test. Providing the user the capability to program different test algorithms and optimize the tests for a specific embedded memory adds important flexibility to built in self test.

SUMMARY OF THE INVENTION

In this invention is described a built in self test (BIST) for embedded DRAM's. Although the concentration is on an embedded DRAM, the method and techniques disclosed herein are applicable to other types of embedded memories, such as SRAM's and Flash memories, and can also be used on commodity memories as well. The BIST is constructed of a controller circuit and a sequencer circuit. The controller circuit provides test sequences to the sequencer circuit that generates test data and timing sequences to be applied to the embedded DRAM. A comparator located in the sequencer is used to compare the output data to the input data of the DRAM and produces a go/no go signal which is connected to an external tester.

The controller circuit includes a BIST controller which is a finite state machine, multiple scan chains used to provide test commands, diagnostic information, and a BIST scan path for testing the BIST logic except the finite state machine. The BIST controller controls the scan chains, shifting in test patterns and commands, and shifting out results. The finite state machine controls the BIST scan operation which is done first to insure that the built in self test circuitry is operating properly.

The sequencer circuit accepts commands and diagnostic information from the controller circuit and turns the commands into timing sequences and data to be connected to the embedded DRAM. The comparator contained within the sequencer circuit compares data outputted from the DRAM to the original input data and creates an error signal when a discrepancy is found. Timing sequences are created with the use of counters and a timing generator contained within the sequencer circuit. DRAM interface buffers contained within the sequencer circuit provide for address data, row and column access signals, write enable and data input and data output to be connected to the embedded DRAM. The sequencer output signals to the embedded DRAM are glitch free resulting from the state transition of the finite state machine being on the rising edge of the BIST clock and the control signals for the DRAM being on the falling transition.

The BIST controller finite state machine is configured to control the operations of the BIST by selecting a test mode, decoding the commands of the test mode, scanning in test patterns, executing the tests and pausing for observations or a retention test. The length of the pause for retention test is a user determined length of time, and the finite state machine can be reset to an initial state by the application of four consecutive logical zeros from any operational state. The BIST supports several test modes including a scan test, a memory test, a burn-in test and a timing fault test. The scan test is used to test the BIST except the controller finite state machine to insure correct functionality before testing of the embedded DRAM takes place. The BIST functionally tests the DRAM using march algorithms which exercises the DRAM in page and non-page modes. During march testing of the DRAM, read-write sequences are moved from cell to cell across the rows and columns of the embedded DRAM.

The BIST also tests refresh and memory retention. The burn-in test exercises the entire embedded memory and can use a march algorithm supported in the memory test mode. Timing fault testing is accomplished by running the BIST clock at an appropriate speed and determining whether various memory operations were performed within the clock period. These timed memory operations include setup time, hold time, and data arrival time for various controls and data signals.

The sequencer is designed for flexibility and can be used with a wide range of embedded memories of different dimensions and timing requirements. The sequence controller finite state machine generates timing sequences for single read/write commands as well as for page mode read/write commands for march elements defined in the controller. The page mode access cycle comprises a row access followed by a sequence of column access. The DRAM under test first latches the row address and then latches, one by one, the column address for the whole page. The sequencer also tests a DRAM refresh mechanism for a variety of refresh states, including self refresh, hidden refresh and RAS only refresh state. The sequencer outputs are implemented such as to be glitch free when the BIST is in use and in a high state when the BIST is not in use. The state transitions are timed to be on the rising edge of the BIST clock and the control timing signals for the DRAM are on the falling edge of the clock producing glitch free sequencer outputs. If test time is important, testing multiple memory banks and multiple words simultaneously with multiple built in self test sequences can be used to reduce test time.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
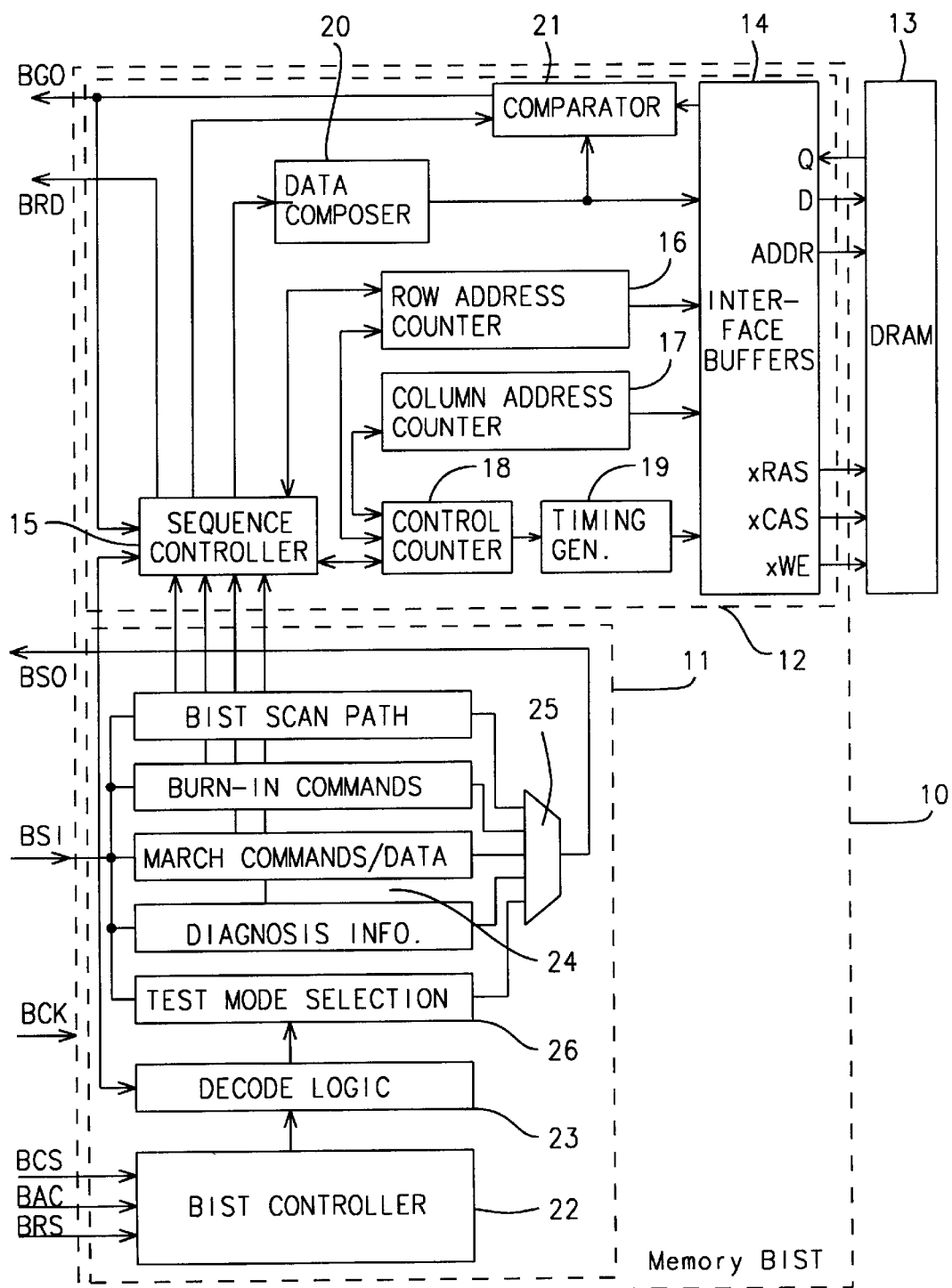
FIG. 1 is a circuit diagram of the memory BIST of this invention.

In FIG. 1 is shown a block diagram of the memory BIST 10 of this invention. The memory BIST 10 is comprised of a controller circuit 11 and a sequencer circuit 12. An embedded DRAM 13 is connected to a DRAM interface buffer 14 within the sequencer circuit. The DRAM interface buffer 14 connects data D, address ADDR, row access signal xRAS, column access signal xCAS, and write enable xWE to the embedded DRAM 13, and receives from the DRAM 13 data output Q. A sequence controller 15 receives commands and data from the controller circuit 11 and controls the row address counter 16 and the column address counter 17 to produce the appropriate address sequence exercise the DRAM 13 for the various march and burn-in tests. A control counter 18 is also controlled by the sequence controller 15 to produce the timing of signals from the timing generator 19 to control the timing sequence of signals connected to the DRAM 13 from the interface buffer 14. Data is transferred from the sequence controller 15 to the data composer 20 which inputs data D to the DRAM 13 through the interface buffer 14. Data form the data composer 20 is also connected to the comparator 21 which received data out Q from the DRAM 13. The comparator compares the input data D from the data composer 20 to the output data Q from the DRAM 13 and outputs a go/no go signal BGO. The sequence controller 15 outputs a BRD signal that indicates when a particular BIST sequence is finished and the BGO signal is valid and can be read for that test sequence.

Continuing to refer to FIG. 1, a BIST controller 22 operating as a finite state machine where the state transitions are controlled by the BIST control section input BCS. A BIST clock BCK is connected to the memory BIST 10 to provide clocking to the controller circuit 11 and the sequencer circuit 12. An activation control signal BAC connected to the BIST controller 22 is at a logical zero when the DRAM is in normal operations and goes high to a logical one to activate the BIST logic to test the embedded DRAM 13. The BIST controller 22 controls scanning in data through a scan input BSI into the scan chains 24 and scanning out data through the multiplexer 25 to the scan output BSO. There are multiple scan chains 24 comprised of a BIST Scan Path, Burn-in Commands, March Commands/Data, and Diagnostic Information. The decode logic 23 and the test mode selection 26 determine which data register to scan in the test commands and when complete activate the sequencer circuit 12. The BRS input signal to the BIST controller 22 resets the BIST and implements a scan of all registers in the BIST controller 22 and the logic in the memory BIST 10 excluding the BIST controller 22. This insures that everything is operating properly before commencing test of the embedded DRAM 13.

Continuing to refer to FIG. 1, the scan chains 24 allow different tests to be performed on the embedded DRAM 13 ranging from non-page mode to page mode where data is either read or written to more complex sequences where data is read, complimented and immediately written back to the DRAM 13. These tests can be performed under timing control to check the performance of the embedded DRAM 13. A burn-in test sequence allows not only for the burn-in testing of the chip and eliminates the need for a tester until at burn-in test..

Figure 2:
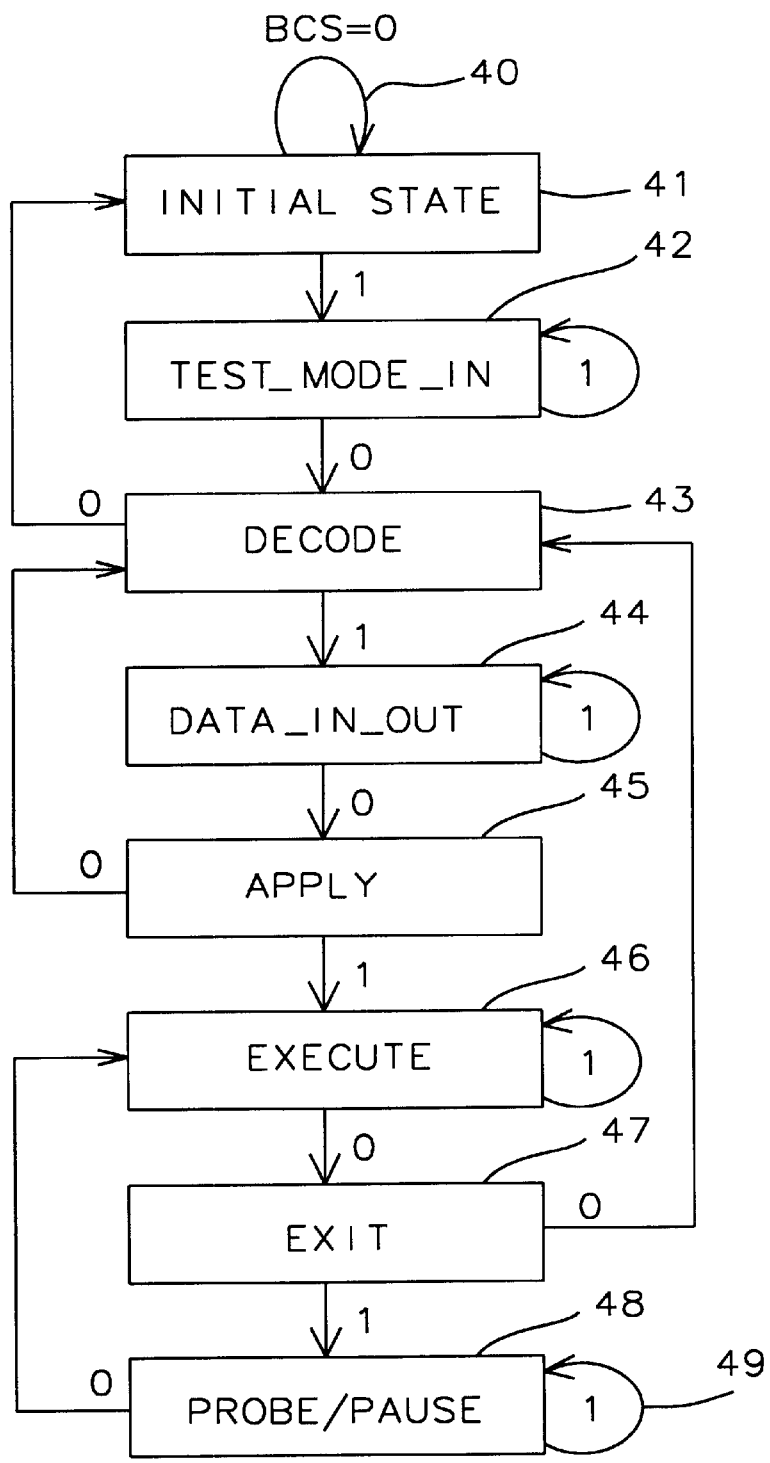
FIG. 2 is a state diagram of the BIST controller finite state machine.

Referring to FIG. 2, a state diagram is shown for the finite state machine of the BIST controller 22 for testing the embedded DRAM 13. The numbers associated with the arrows between states represent state transitions controlled by BCS as do any numbers associated with the state transition arcs 40. The initial state 41 is entered by applying a low signal on BRS connected to the BIST controller 22 after scan test mode has finished successfully. While BRS is low and the BIST finite state machine is active, four consecutive logical zero's will reset the finite state machine to the initial state. This can be seen by assuming the finite state machine is at the probe/pause state 48. A BCS=0 will make the transition to the execute state 46. A BCS=1 at the probe/pause state will make the transition loop 49 back to the probe pause state. A second consecutive BCS=0 will make the transition from the execute state 46 to the exit state 47. A third consecutive BCS=0 will take the finite state machine to the decode state 43, and the fourth consecutive BCS=0 will return the finite state machine from the decode state 43 to the initial state 41. Any additional consecutive BCS=0 will take the finite state machine on the transition loop 40 back to the initial state.

Continuing to refer to FIG. 2, a BCS=1 signal applied when the finite state machine is in the initial state 41 will take the finite state machine to the next state, test_mode_in 42 where the test mode is selected. A BCS=0 takes the finite state machine from the test_mode_in state 42 to the decode state 43. The decode state 43 decodes commands and generates internal control signals including selecting the appropriate scan chain for shifting in a data sequence. Applying BCS=0 at the decode state 43 will take the finite state machine back to the initial state 41. Applying BCS=1 will move the finite state machine from the decode state 43 to the data_in_out state 44 where test input is shifted in and test results are shifted out. User specified parameters and test algorithms are shifted into the BIST 10 during the data_in_out state 44. An application of BCS=1 while in the data_in_out state 44 loops the finite state machine back to the data_in_out state 44 to shift in more test input and shift out additional test results. A BCS=0 at the data_in_out state 44 takes the finite state machine to the apply state 45 where the scan test is applied and the BIST is activated. The loop that includes states of decode 43, data_in_out 44 and apply 45 is a loop that runs the scan tests that tests out the BIST logic 10 before testing the embedded DRAM 13.

Continuing to refer to FIG. 2, a BCS=1 at the apply state 45 takes the finite state machine to the execute state 46 where memory tests such as function test, burn-in and memory AC test are performed. A BCS=0 at the execute state 46 takes the finite state machine to the exit state 47 where the testing is paused for observation and an exit of the execution phase can be done with a BCS=0. If a BCS=1 is applied when in the exit state 47, the finite state machine is taken to the probe/pause state 48 where results of testing can be shifted out or the storage retention test can be performed using a pause for a user determined time interval. Memory testing and diagnosis is performed in the state loop containing execute 46, exit 47 and probe pause 48 states.

Figure 3:
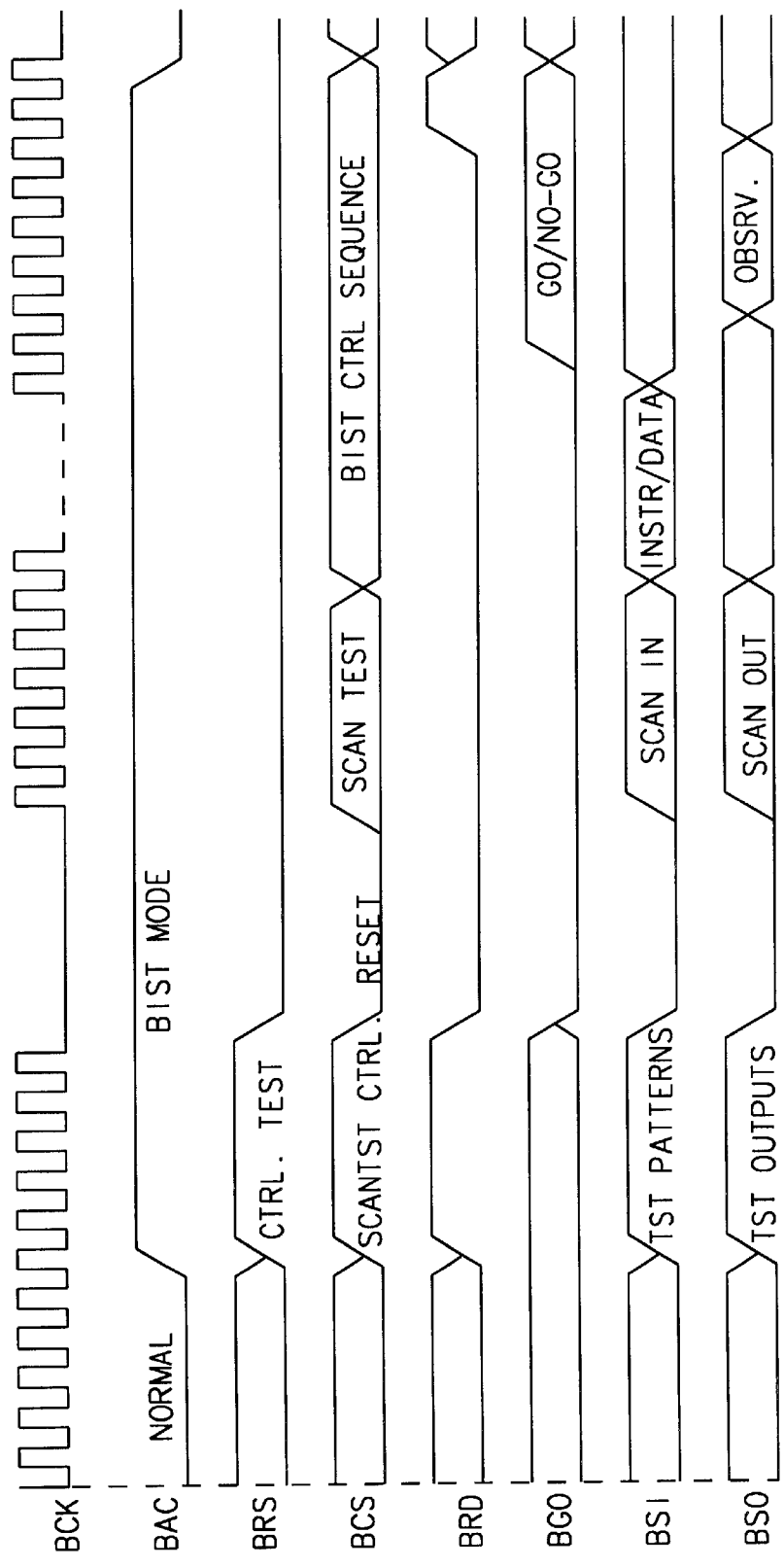
FIG. 3 is a timing diagram for the BIST control circuit sequence.

In FIG. 3 is shown the BIST circuit control sequence. When the BAC control signal is high, a logical one, the BIST circuit is activated to test the embedded memory 13. All signals are synchronized with the BIST clock, BCK. The BRS signal is pulled high along with BCS at the beginning of the BAC control signal to perform a scan test to verify that the BIST controller is operating correctly. Scan chains are formed between BSI and BSO to apply patterns and collect responses. When the scan test is completed the BRS signal is pulled low to reset the BIST controller, and BCS remains low to generate a reset sequence. The BRD and BGO signal are also brought low, and the BIST controller performs a scan test for the remainder of the BIST circuitry. Once the scan test is completed, a test algorithm is applied to the embedded DRAM 13 in accordance with the control sequence of the finite state machine shown in FIG. 2. At the end of the test sequence BRD is brought high and BGO is sampled to read out the test results. Then BAC is set to a low state to return the DRAM 13 to normal operations.

Figure 4:
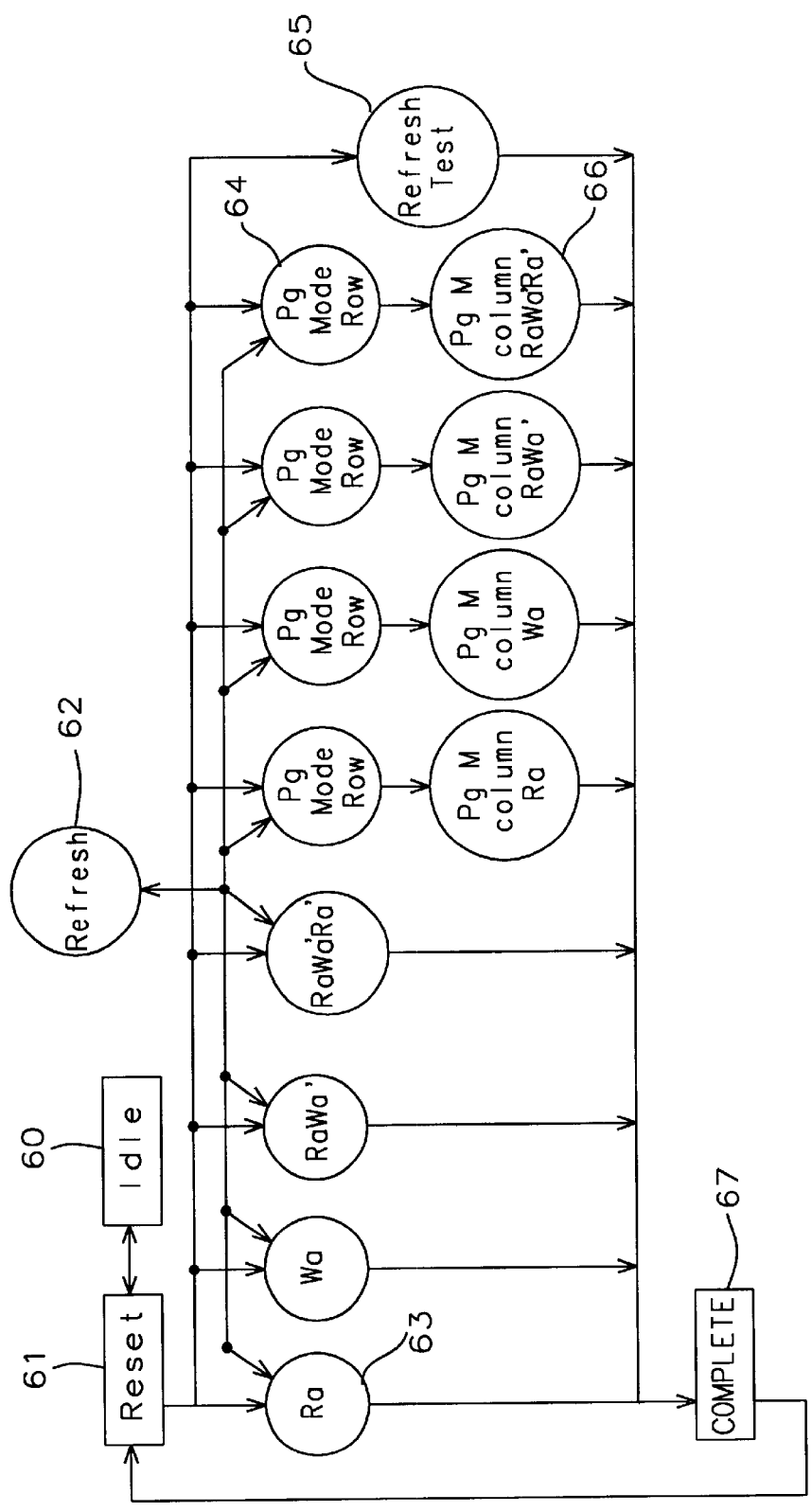
FIG. 4 is a state diagram of the sequence controller for march tests and refresh.

In FIG. 4 is shown the state diagram of the sequence controller finite state machine for march and refresh tests. Timing sequence generation modules, shown as circles in FIG. 4, are implemented for single read/write commands 63 and page mode (Pg M) read/write commands 64 for march tests defined in the controller 11. The test sequences performed on each cell of the embedded DRAM are: Ra read; Wa write; RaWa' read contents of cell, complement and immediately write back the complement; and RaWa'Ra' read contents of cell, complement and immediately write back the complement, and read back the compliment from the cell. When in page mode there are both row 64 and column accesses 66. The row address is latched first by the embedded DRAM 13. Then the column address is latched, column by column, until the entire page is covered, and for each latched column address a test sequence, such as Ra or RaWa'Ra', is performed. A refresh test 65 is performed to cover self refresh, hidden refresh and RAS only refresh, and a refresh 62 of the embedded DRAM 13 is accommodated by the built in self test to allow the memory cells to be maintained a proper state. When testing begins the BIST moves from an idle state 60 to a reset state 61. After the various tests are completed 67, the BIST returns to the reset state 61. If no other tests are to be performed, the BIST returns to the idle state 60.

While the invention has been particularly shown and described with reference to preferred embodiments thereof, it will be understood by those skilled in the art that various changes in form and details may be made without departing from the spirit and scope of the invention.

What is claimed is:

1. A programmable built in self test circuit, comprising:
    a) a controller containing a finite state machine connected to a sequencer circuit,
    b) said finite state machine is stepped through a plurality of steps to control tests to an embedded DRAM after said finite state machine is initialized with a plurality of consecutive logical zeros,
    c) said sequencer circuit connected to said embedded DRAM,
    d) a comparator circuit connected to output of said DRAM,
    e) said controller provides programmable test sequences from a scan in port to said sequencer circuit,
    f) said sequencer circuit generates test data and timing sequences to be applied to said DRAM,
    g) said comparator circuit compares output of said DRAM to said test data.

2. The test circuit of claim 1, wherein said plurality of consecutive logical zeros required to initialized said finite state machine is four.

3. The test circuit of claim 1, wherein said controller provides for scanning in and scanning out test data which further provides for scan testing of built in self test circuitry, commands for march testing said embedded DRAM, commands for burn-in testing, test mode selection and diagnostic information.

4. The test circuit of claim 1, wherein a sequence controller contained within said sequencer circuit creates test data to be applied to said DRAM.

5. The test circuit of claim 1, wherein said comparator circuit produces an error signal when test result do not compare to said test data.

6. The test circuit of claim 1, wherein test patterns and commands are scanned into and out of said controller circuit.

7. The test circuit of claim 1, wherein connections to said DRAM are in a high impedance state when said test circuit is not in use.

8. The test circuit of claim 1, wherein different embedded memory types can be tested including DRAM, SRAM, and Flash memory and including commodity memory.

9. A method of a built in self test using a finite state machine to control the testing of an embedded DRAM, comprising:
   a) initializing a finite state machine to perform a built in self test by applying a plurality of consecutive logical zeros to step the finite state machine to an initial state,
   b) stepping said finite state machine and then selecting a test mode,
   c) stepping said finite state machine and then decoding commands of said test mode,
   d) stepping said finite state machine and then scanning in test patterns and scanning out test results,
   e) stepping said finite state machine and then applying a scan test and activating said built in self test,
   f) stepping said finite state machine and then testing of an embedded DRAM memory,
   g) stepping said finite state machine and then exiting testing phase or pausing for observation,
   h) stepping said finite state machine and then shifting out test results or pausing for retention test,
   i) stepping said finite state machine and then returning to testing of said embedded DRAM.

10. The method of claim 9, wherein applying four consecutive logical zeros to said finite state machine at any state returns said finite state machine to an initial state.

11. The method of claim 9, wherein scan testing is done in a loop running through decode of commands, scanning in test patterns and scanning out test results, and applying said scan test.

12. The method of claim 9, wherein pausing for said retention test allows pausing for a user determined time interval.

13. The method of claim 9, wherein testing multiple memory banks and multiple words simultaneously using multiple built in self test sequences can be used to reduce test time.

14. The method of claim 9, wherein controlling the testing of an embedded DRAM is done with other than a finite state machine.

15. The method of claim 9, wherein changing state in said finite state machine is done on the rising edge of a test clock and controlling timing signals for said embedded DRAM are applied on the falling edge of said test clock to prevent glitches.

16. The method of claim 9, wherein testing of a variety of embedded memories including DRAM, SRAM and Flash memory can be done and including commodity memory chips.

17. The method of claim 9, wherein the plurality of consecutive logical zeros to step the finite state machine to said initial state is four.

18. A test method for an embedded DRAM, comprising:
   a) resetting test circuitry by applying a consecutive plurality of logical zeros to a finite state machine in a test controller,
   b) selecting test mode with said test controller and read-write sequence with a sequence circuit,
   c) marching said read-write sequence across rows and columns of an embedded DRAM by connecting test data from said sequence circuit to said embedded DRAM,
   d) comparing test results with test data,
   e) providing for refresh of said embedded DRAM during test,
   f) returning to reset with said sequence of said plurality of logical zeros applied to said finite state machine and selecting next test mode.

19. The test method of claim 18, wherein selecting test mode comprises selecting page mode, non-page mode, refresh and retention test.

20. The test method of claim 19, wherein selecting to test refresh comprises self refresh, hidden refresh and RAS only refresh.

21. The test method of claim 19, wherein selecting page mode of said DRAM latches row addresses first then column addressers one by one for an entire memory page.

22. The test method of claim 18, wherein testing of a variety of embedded memories including DRAM, SRAM and Flash memory can be done and including commodity memory chips.

23. The method of claim 18, wherein resetting said test circuitry is done by applying four consecutive logical zeros to said finite state machine.

* * * * *